United States Patent
Ke

(10) Patent No.: US 11,662,658 B2
(45) Date of Patent: May 30, 2023

(54) PHOTO-MASK AND SEMICONDUCTOR PROCESS

(71) Applicant: UNITED MICROELECTRONICS CORP., Hsinchu (TW)

(72) Inventor: You-Ming Ke, Singapore (SG)

(73) Assignee: UNITED MICROELECTRONICS CORP., Hsinchu (TW)

(*) Notice: Subject to any disclaimer, the term of this patent is extended or adjusted under 35 U.S.C. 154(b) by 233 days.

(21) Appl. No.: 17/128,246

(22) Filed: Dec. 21, 2020

(65) Prior Publication Data

US 2022/0146926 A1 May 12, 2022

(30) Foreign Application Priority Data

Nov. 12, 2020 (CN) .......................... 202011259051.8

(51) Int. Cl.
| | | |
|---|---|---|
| *G03F 1/36* | (2012.01) | |
| *G03F 1/38* | (2012.01) | |
| *G03F 7/20* | (2006.01) | |
| *H01L 21/027* | (2006.01) | |
| *G03F 7/00* | (2006.01) | |

(52) U.S. Cl.
CPC .................. *G03F 1/38* (2013.01); *G03F 1/36* (2013.01); *G03F 7/0002* (2013.01); *H01L 21/0274* (2013.01)

(58) Field of Classification Search
None
See application file for complete search history.

(56) References Cited

U.S. PATENT DOCUMENTS

| | | | | |
|---|---|---|---|---|
| 5,725,972 A | * | 3/1998 | Takeshita | G03F 1/50 430/324 |
| 6,539,521 B1 | * | 3/2003 | Pierrat | G03F 1/36 430/5 |
| 2005/0009341 A1 | * | 1/2005 | Chang | G03F 1/70 438/689 |
| 2005/0009344 A1 | * | 1/2005 | Hwang | G03F 1/36 438/689 |
| 2005/0095513 A1 | * | 5/2005 | Yao | G03F 1/70 430/394 |
| 2009/0142675 A1 | * | 6/2009 | Kim | G03F 1/36 430/5 |
| 2010/0009273 A1 | * | 1/2010 | Kim | G03F 1/36 430/5 |
| 2013/0302724 A1 | * | 11/2013 | Yang | G03F 1/38 430/5 |
| 2019/0141810 A1 | * | 5/2019 | Zhang | H05B 45/14 |

FOREIGN PATENT DOCUMENTS

| | | | | | |
|---|---|---|---|---|---|
| CN | 103513508 A | * | 1/2014 | | |
| JP | 62221111 A | * | 9/1987 | | |
| JP | 07253651 A | * | 10/1995 | | |
| JP | 2005157022 A | * | 6/2005 | | |
| JP | 2008046624 A | * | 2/2008 | | |
| KR | 100416613 A | * | 2/2004 | | |
| KR | 20060039638 A | * | 5/2006 | | |
| WO | WO-2005008754 A1 | * | 1/2005 | ......... | G03F 7/70433 |

* cited by examiner

*Primary Examiner* — Martin J Angebranndt
(74) *Attorney, Agent, or Firm* — WPAT, P.C.

(57) ABSTRACT

A photo-mask and a semiconductor process are provided. The photo-mask includes a substrate and a non-printable pattern on the substrate. A pattern size of the non-printable pattern is smaller than a critical resolution of a lithography equipment using the photo-mask to perform a lithography process.

15 Claims, 3 Drawing Sheets

PHOTO-MASK AND SEMICONDUCTOR PROCESS

BACKGROUND

This application claims the benefit of People's Republic of China application Serial No. 202011259051.8, filed Nov. 12, 2020, the subject matter of which is incorporated herein by reference.

Technical Field

The disclosure relates to a photo-mask and a semiconductor process, and more particularly to a photo-mask comprising a non-printable pattern and a semiconductor process using a photo-mask comprising a non-printable pattern to expose.

Description of the Related Art

In order to form a designed integrated circuit to a semiconductor wafer, a photo-mask formed with a circuit layout is usually used. In a lithography process, the circuit layout defined by the photo-mask is transferred to a photo-resist layer through an exposing step, and then transferred to a semiconductor substrate under the photo-resist layer through an etching process. Therefore, the lithography process is an important key for the semiconductor manufacturing. Providing a photo-mask with improved quality is beneficial to improve the lithography process.

SUMMARY

The present disclosure relates to a photo-mask and a semiconductor process.

According to an embodiment of the present disclosure, a photo-mask is provided. The photo-mask includes a substrate and a non-printable pattern on the substrate. A pattern size of the non-printable pattern is smaller than a critical resolution of a lithography equipment using the photo-mask to perform a lithography process.

According to another embodiment of the present disclosure, a semiconductor process is provided. The semiconductor process includes providing a semiconductor structure, wherein the semiconductor structure includes a photo-resist layer. The semiconductor process further includes an exposing step for exposing the photo-resist layer by an exposure light with using a photo-mask, wherein the photo-mask includes a substrate and a non-printable pattern on the substrate. The non-printable pattern of the photo-mask is not transferred to the photo-resist layer through the exposing step.

The above and other embodiments of the disclosure will become better understood with regard to the following detailed description of the non-limiting embodiment(s). The following description is made with reference to the accompanying drawings.

DETAILED DESCRIPTION

Embodiments disclosed herein relate to a photo-mask and a semiconductor process. The photo-mask may be used in a lithography process in a semiconductor manufacturing process. Specifically, in the lithography process, the photo-mask may be used in a lithography equipment, and a pattern defined by the photo-mask may be transferred to a photo-resist layer on a semiconductor substrate through an exposing step, a developing step, etc. The photo-mask includes a substrate and a non-printable pattern on the substrate. The non-printable pattern of the photo-mask has a pattern size smaller than a critical resolution of the lithography equipment. As such, the non-printable pattern is not transferred to the photo-resist layer by the lithography process. Meanwhile, a light transmission ratio of a region of the photo-mask including the non-printable pattern can be reduced, and heat absorption of lenses of the lithography equipment can be reduced correspondingly. Therefore, in embodiments of the present disclosure, the problems of deformation and short lifetime of the lenses resulted from the heat absorption of the lenses as well as focusing error and poor control in a line width resulted from the deformation of the lenses can be avoided.

The illustrations may not be necessarily drawn to scale, and there may be other embodiments of the present disclosure which are not specifically illustrated. Thus, the specification and the drawings are to be regarded as an illustrative sense rather than a restrictive sense. Moreover, the descriptions disclosed in the embodiments of the disclosure such as detailed construction, manufacturing steps and material selections are for illustration only, not for limiting the scope of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Moreover, use of ordinal terms such as "first", "second", "third", etc., in the specification and claims to modify an element or a step does not by itself imply any priority, precedence, or order of one claim element or step over another, but are used merely as labels to distinguish one claim element or step having a certain name from another element or step having the same name (but for use of the ordinal term) to distinguish the claim elements or steps.

Figure 1:
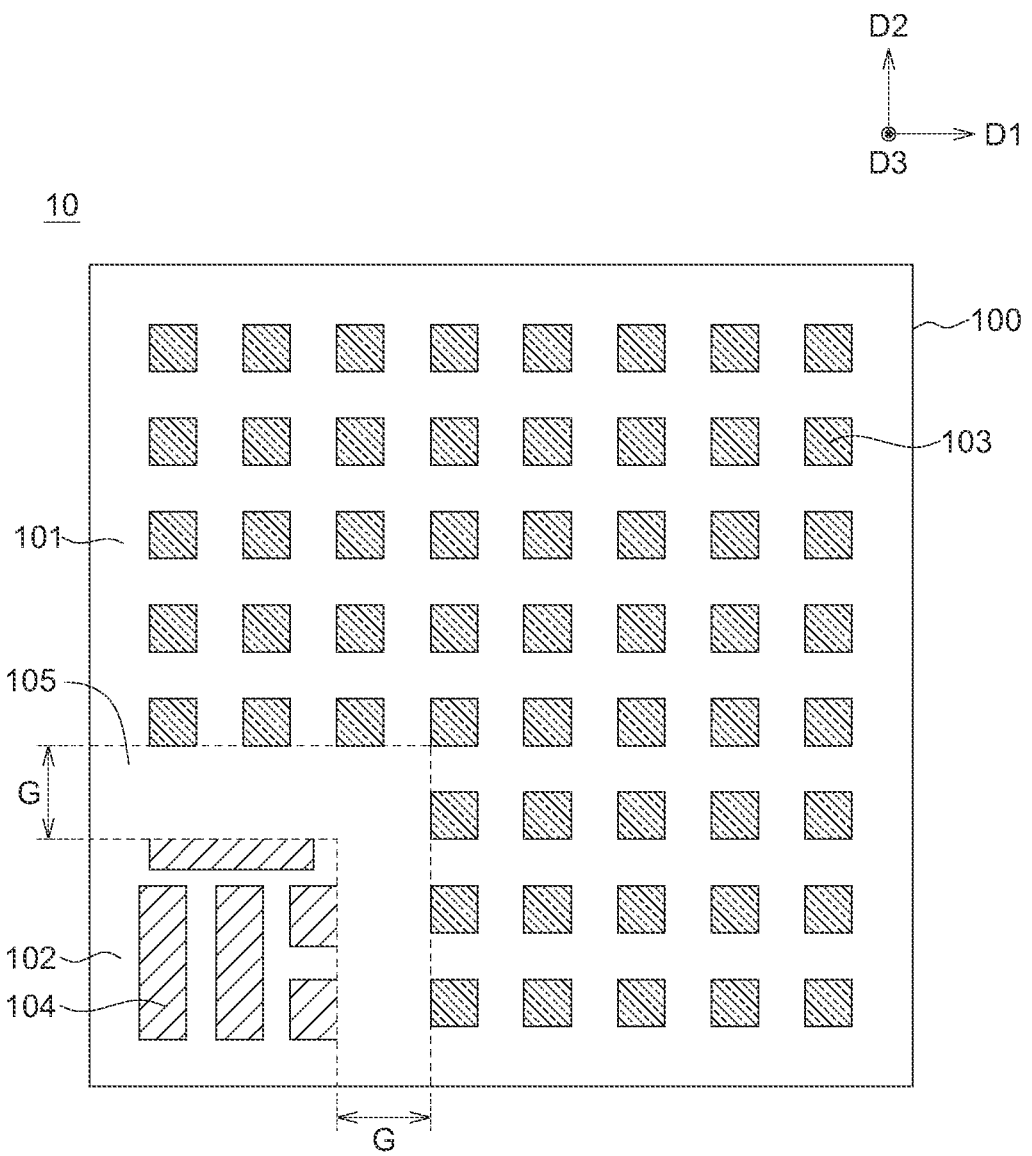
FIG. 1 illustrates a schematic top view of a photo-mask according to an embodiment of the present disclosure.

FIG. 1 is referred to, which illustrates a schematic top view of a photo-mask 10 according to an embodiment of the present disclosure. The photo-mask 10 may be, for example, a reticle. The photo-mask 10 includes a substrate 100. The substrate 100 may be a transparent substrate, such as a transparent substrate formed by organic or inorganic materials. The organic materials may include polymers, such as methyl methacrylate. The inorganic materials may include magnesium fluoride, titanium dioxide, silicon dioxide, etc.

The substrate 100 may include a first substrate region 101, a second substrate region 102 and a third substrate region 105. The third substrate region 105 is between the first substrate region 101 and the second substrate region 102. In a third direction D3 (i.e. a normal direction to a surface of the substrate 100), the first substrate region 101, the second substrate region 102 and the third substrate region 105 are non-overlapping with each other. An area of the first substrate region 101 may be larger than an area of the second substrate region 102. The present disclosure is not limited thereto.

The photo-mask 10 includes a non-printable pattern 103 and a printable pattern 104 formed on the substrate 100. The non-printable pattern 103 is formed on the first substrate region 101 of the substrate 100. The printable pattern 104 is formed on the second substrate region 102 of the substrate 100. The third substrate region 105 may not include any pattern thereon. Specifically, the non-printable pattern 103 and the printable pattern 104 are light-shielding structures formed on the surface of the substrate 100 and can obstruct the passage of a light. In an embodiment, the non-printable pattern 103 and the printable pattern 104 may be formed on the same surface of the substrate 100. In another embodiment, the non-printable pattern 103 and the printable pattern 104 may be formed on difference surfaces of the substrate 100. The non-printable pattern 103 and the printable pattern 104 may include opaque materials. In an embodiment, the non-printable pattern 103 and the printable pattern 104 may include a metal, such as chromium (Cr) or tantalum (Ta). The non-printable pattern 103 and the printable pattern 104 may include the same materials or may include different materials.

As shown in FIG. 1, the non-printable pattern 103 may include a plurality of pattern dots disposed apart from each other. In the embodiment shown in FIG. 1, the plurality of pattern dots is drawn as pattern dots with the same sizes and shapes. The present disclosure is not limited thereto. The plurality of pattern dots may include pattern dots with different sizes and/or shapes. The plurality of pattern dots may be scattered or arranged as an array on the first substrate region 101 of the substrate 100. Generally, the light transmission ratio of the first substrate region 101 decreases as the coverage density of the plurality of pattern dots increases. The printable pattern 104 may include a plurality of feature patterns disposed apart from each other.

The difference between the non-printable pattern 103 and the printable pattern 104 is that, the non-printable pattern 103 is not imaged by the lithography process, while the printable pattern 104 is imaged by the lithography process. In other words, the non-printable pattern 103 is not transferred to a photo-resist layer by the lithography process, while the printable pattern 104 is transferred to the photo-resist layer by the lithography process.

There is a gap distance G between the first substrate region 101 and the second substrate region 102. The gap distance G may be equal to a lateral size of the third substrate region 105. The gap distance G may be defined as a distance in a plane of a first direction D1 and a second direction D2, such as a minimum distance between the first substrate region 101 and the second substrate region 102. In an embodiment, the gap distance G may represent a distance between a boundary of the first substrate region 101 and a boundary of the second substrate region 102 along the first direction D1 or the second direction D2. The first direction D1, the second direction D2 and the third direction D3 are perpendicular to each other. In another embodiment, the gap distance G may represent a distance between a boundary of the non-printable pattern 103 and a boundary of the printable pattern 104 along the first direction D1 or the second direction D2. The gap distance G may be larger than 10 micrometers (μm). The gap distance G larger than 10 micrometers between the first substrate region 101 and the second substrate region 102 can prevent the non-printable pattern 103 near the second substrate region 102 from being imaged or transferred into the photo-resist layer of the semiconductor structure by the lithography process.

Specifically, the non-printable pattern 103 is not imaged by the lithography process performed by the lithography equipment with using the photo-mask 10 since the non-printable pattern 103 has a pattern size (such as a maximum size of one pattern dot of the plurality of pattern dots) smaller than a critical resolution of the lithography equipment, and the non-printable pattern 103 has a pattern distance (such as a minimum distance between adjacent two pattern dots of the plurality of pattern dots) corresponding to the critical resolution. The printable pattern 104 is imaged by the lithography process performed by the lithography equipment with using the photo-mask 10 since the printable patter 104 has the pattern size (such as a minimum size of the feature pattern) equal to or larger than the critical resolution of the lithography equipment. The critical resolution of the lithography equipment and the pattern distance of the non-printable pattern 103 corresponding to the critical resolution may be varied according to the types of the light source and the lens used by the lithography equipment. For example, as the lithography equipment uses an ArF light source having the wavelength of about 193 nm, the critical resolution of the lithography equipment can be about 35 nanometers (nm). For example, as the lithography equipment uses a KrF light source having the wavelength of about 248 nm, the critical resolution of the lithography equipment can be about 65 nm.

Figure 2:
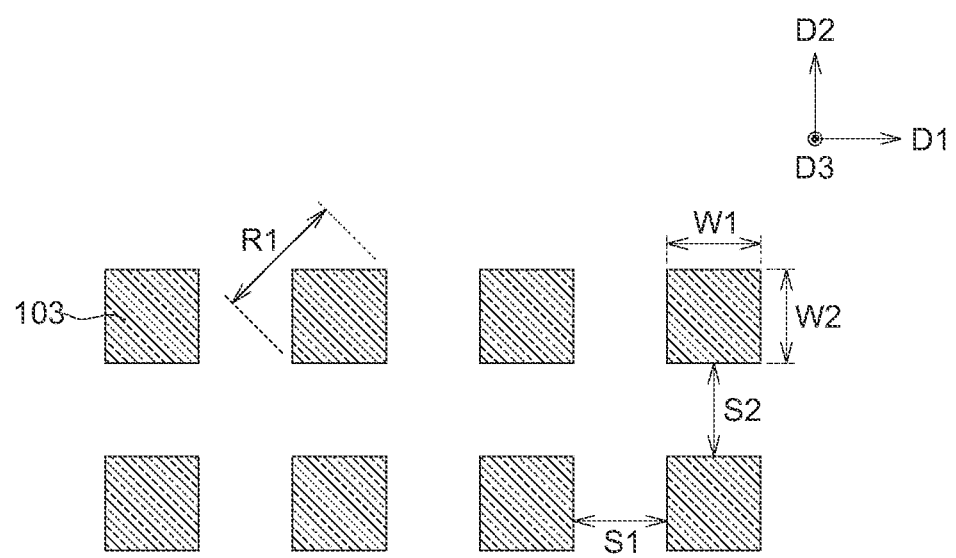
FIG. 2 illustrates a schematic top view of a non-printable pattern according to an embodiment of the present disclosure.

Please refer to FIG. 1 and FIG. 2 at the same time. FIG. 2 is an enlarged view of a portion of the non-printable pattern 103 shown in FIG. 1. In an embodiment, the non-printable pattern 103 is not transferred to the photo-resist layer through the lithography process with using the lithography equipment using the ArF light source since the pattern size of the pattern dot of the non-printable pattern 103 is smaller than about 35 nm (the critical resolution of the lithography equipment), and the pattern distance of the non-printable pattern 103 is larger than about 50 nm. For example, the pattern size of the pattern dot of the non-printable pattern 103 may be a size W1 in the first direction D1 and/or a size W2 in the second direction D2 of the pattern dot, such as a larger one of the size W1 and the size W2. When the pattern dot has a square shape, the size W1 and the size W2 may be widths of the square shape. However, the present disclosure is not limited thereto. When the pattern dot has a rectangle shape, the larger one of the size W1 and the size W2 may be a length of the rectangle shape, and regarded as the pattern size of the pattern dot. For example, the pattern distance of the non-printable pattern 103 may be a distance S1 in the first direction D1 and/or a distance S2 in the second direction D2 between the pattern dots, such as a smaller one of the distance S1 and the distance S2.

In another embodiment, the non-printable pattern 103 is not transferred to the photo-resist layer through the lithography process with using the lithography equipment using the KrF light source since the pattern size of the pattern dot of the non-printable pattern 103 is smaller than about 65 nm (the critical resolution of the lithography equipment), and the pattern distance of the non-printable pattern 103 is larger than about 90 nm. For example, the pattern size of the pattern dot of the non-printable pattern 103 may be the size W1 in the first direction D1 and/or the size W2 in the second direction D2 of the pattern dot, such as the larger one of the size W1 and the size W2. When the pattern dot has a square shape, the size W1 and the size W2 may be widths of the square shape. However, the present disclosure is not limited thereto. When the pattern dot has a rectangle shape, the larger one of the size W1 and the size W2 may be a length of the rectangle shape, and regarded as the pattern size of the pattern dot. For example, the pattern distance of the non-printable pattern 103 may be the distance S1 in the first direction D1 and/or the distance S2 in the second direction D2 between the pattern dots, such as the smaller one of the distance S1 and the distance S2.

In other embodiments, the pattern size of the pattern dot of the non-printable pattern 103 that is smaller than the critical resolution of the lithography equipment may be defined in another way. For example, when the pattern dot has a shape of a square or a rectangle, the pattern size may be a diagonal of the square or the rectangle, such as a diagonal R1 shown in FIG. 2. Alternatively, when the pattern dot has a shape of a circle, the pattern size may be a diameter of the circle. The present disclosure is not limited thereto.

In an embodiment, the second substrate region 102 may be defined as a region of the substrate 100 where a circuit feature pattern is formed, and the first substrate region 101 may be defined as a region of the substrate 100 where no circuit feature pattern is formed. When the photo-mask 10 is used in the lithography process, the printable pattern 104 on the second substrate region 102 is transferred to the photo-resist layer of the semiconductor structure, the non-printable pattern 103 on the first substrate region 101 is not transferred to the photo-resist layer of the semiconductor structure since the non-printable pattern 103 has the pattern size smaller than the critical resolution of the lithography equipment for performing the lithography process and has the pattern distance corresponding to the critical resolution. In other words, after the exposing step and the developing step of the lithography process, a region of the photo-resist layer corresponding to the second substrate region 102 shows the printable pattern 104 on the second substrate region 102, and a region of the photo-resist layer corresponding to the first substrate region 101 does not show any pattern. As such, when performing a follow-up etching step to the semiconductor structure including the photo-resist layer, a region of a semiconductor substrate of the semiconductor structure corresponding to the second substrate region 102 shows a pattern which corresponds to the printable pattern 104, and a region of the semiconductor substrate of the semiconductor structure corresponding to the first substrate region 101 does not show a pattern which corresponds to the non-printable pattern 103.

Figure 3:
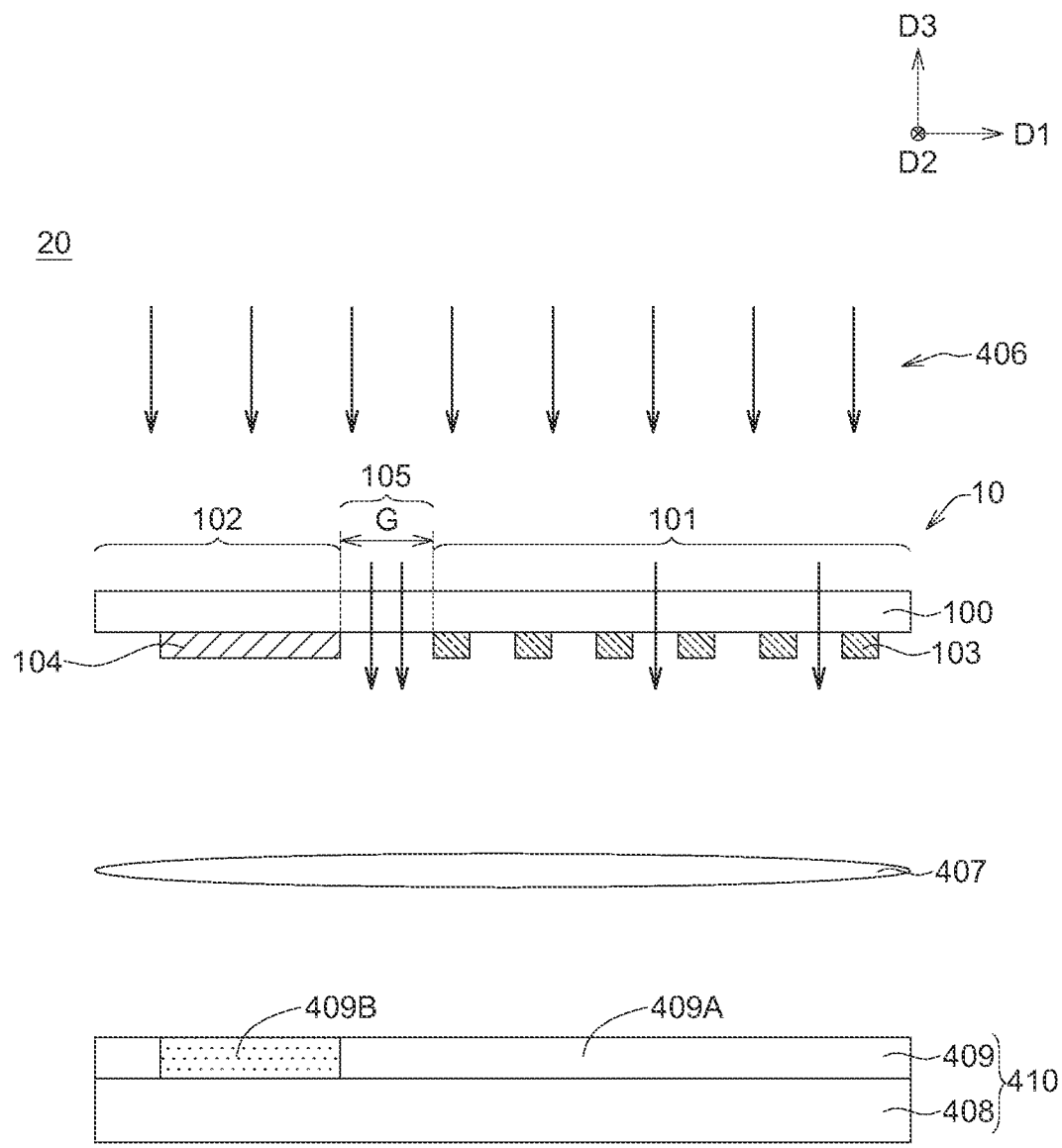
FIG. 3 illustrates a semiconductor process according to an embodiment of the present disclosure.

FIG. 3 is referred to, which illustrates a semiconductor process 20 according to an embodiment of the present disclosure. The semiconductor process 20 may use the aforementioned photo-mask 10. The photo-mask 10 includes the substrate 100, the non-printable pattern 103 and the printable pattern 104 on the substrate 100. The semiconductor process 20 includes using the lithography equipment and the photo-mask 10 to perform the lithography process so as to transfer the printable pattern 104 defined by the photo-mask 10 to the semiconductor structure 410.

Firstly, the semiconductor process 20 includes providing the semiconductor structure 410. The semiconductor structure 410 may include a semiconductor substrate 408 and a photo-resist layer 409 on a surface of the semiconductor substrate 408. In an embodiment, the semiconductor substrate 408 may include a silicon wafer. In another embodiment, the semiconductor substrate 408 may include a material layer formed on the silicon wafer. The material layer may include a dielectric layer, a conductive layer, a semiconductor layer, etc. The present disclosure is not limited thereto.

Then, the semiconductor structure 410 is provided in the lithography equipment. The lithography equipment includes a light source 406 for providing a light (i.e. an exposure light) and a lens 407. The photo-mask 10 is disposed between the light source 406 and the lens 407. The lens 407 is disposed between the photo-mask 10 and the semiconductor structure 410. The photo-mask 10, the lens 407 and the semiconductor structure 410 are in a light transmission path of the light emitted by the light source 406.

In an embodiment, a photo-resist used to form the photo-resist layer 409 may include a positive photoresist, a negative photoresist, etc. The photo-resist layer 409 may be formed by using a spin coating method to coat the semiconductor substrate 408 with the photo-resist. The lens 407 may include a projection lens. The light source 406 may include an excimer laser, an electron beam, a high energy electron beam, an ion beam, a focused ion beam, etc. For example, the light source 406 may be an ArF ultraviolet (UV) excimer laser or a KrF ultraviolet excimer laser.

In an embodiment, the lithography equipment may include other lenses, such as a condenser lens disposed between the light source 406 and the photo-mask 10, and/or additional lenses disposed between the photo-mask 10 and the semiconductor structure 410.

The semiconductor process 20 further includes an exposing step. The exposing step is performed after the semiconductor structure 410 including the photo-resist layer 409 is provided and the lithography equipment and the photo-mask 10 are disposed. The exposing step is for exposing the photo-resist layer 409 by the lithography equipment with using the photo-mask 10 and the light source 406 for emitting the light (i.e. the exposure light) so as to transfer the printable pattern 104 of the photo-mask 10 to the photo-resist layer 409 of the semiconductor structure 410.

As shown in FIG. 3, in the exposing step, the exposure light emitted from the light source 406 passes through the photo-mask 10, wherein the exposure light passes through the first substrate region 101 having the non-printable pattern 103, the second substrate region 102 having the printable pattern 104 is disposed, and the third substrate region 105 of the substrate 100 at the same time. The non-printable pattern 103 and the printable pattern 104 can obstruct the passage of by reflecting or absorbing the exposure light, for example. Meanwhile, the portion of the photo-mask 10 without the non-printable pattern 103 and the printable pattern 104 on the substrate 100 permits the exposure light to pass there through. After passing through the photo-mask 10, the exposure light passes through the lens 407 and then arrives on the photo-resist layer 409 of the semiconductor structure 410 so as to project the printable pattern 104 of the photo-mask 10 onto the photo-resist layer 409.

The printable pattern 104 is transferred to the photo-resist layer 409 through the exposing step since the pattern size of the printable pattern 104 is equal to or larger than a critical resolution of the lithography equipment using the photo-mask 10.

The non-printable pattern 103 is not transferred to the photo-resist layer 409 through the exposing step since the non-printable pattern 103 has the pattern size smaller than the critical resolution of the lithography equipment using the photo-mask 10 and has the pattern distance corresponding to the critical resolution.

As shown in FIG. 3, the photo-resist layer 409 has an unexposed region 409B corresponding to the printable pattern 104, and has an exposed region 409A formed through the exposing step. The exposed region 409A of the photo-resist layer 409 includes a region corresponding to the non-printable pattern 103. The unexposed region 409B has a pattern corresponding to the printable pattern 104.

Then, the semiconductor process 20 may further include a post exposure bake (PEB) step, a developing step, a hard bake step, etc. so as to remove the exposed region 409A or the unexposed region 409B of the photo-resist layer 409 according to the property of the used photo-resist.

Then, the semiconductor process 20 may further include an etching step by which the pattern of the photo-resist layer 409 can be transferred into the semiconductor substrate 408 of the semiconductor structure 410. The semiconductor substrate 408 may comprise the silicon wafer and/or the material layer. The material layer may include a dielectric layer, a conductive layer, a semiconductor layer, etc. A pattern corresponding to the printable pattern 104 is formed in the semiconductor substrate 408 thorough the etching step.

In a comparative example, the first substrate region 101 has no pattern formed thereon, and is a transparent substrate entirely. Therefore, the light passes through the first substrate region 101 almost entirely. As such, the lens 407 disposed between the photo-mask 10 and the semiconductor 410 absorbs more energy (heat) of the light and thus has the degraded lifetime and performance. In another comparative example, the first substrate region 101 has a dummy printable pattern formed thereon. The dummy printable pattern of the first substrate region 101 can be transferred to the photo-resist layer 409 through the exposing step, and it causes a redundant pattern other than the circuit layout patterns in the semiconductor structure, resulting in technical problems of layout design and space utilization for the semiconductor structure, etc.

In the embodiment according to the present disclosure, the first substrate region 101 has the non-printable pattern 103, and therefore has a lower light transmission ratio (such as about 60%) compared with a light transmission ratio (such as about 100%) of the first substrate region 101 having no pattern in the comparative example. Thus, in embodiments, the problem of optical failure caused by the deformation (such as expansion) of the lens resulted from absorbing energy (heat) of the light can de decreased. Besides, in embodiments, the non-printable pattern 103 of the first substrate region 101 is not transferred to the semiconductor structure 410, and thus there is no technical problem of layout design and space utilization of the semiconductor structure that would occur in the comparative example.

Accordingly, in embodiments, the non-printable pattern is disposed in the photo-mask, by which the light transmission ratio of the photo-mask can be reduced without affecting the transfer of the circuit layout in the semiconductor process. Thus, the light reaching the lens between the photo-mask and the semiconductor structure can be decreased, and the heating effect to the lens resulted from absorbing energy (heat) of the light can be decreased. Moreover, the problems of deformation (such as expansion) and short lifetime of the lenses resulted from the heating effect, as well as out of focus, focusing error, etc. of the optical failure, and poor control in a line width resulted from the deformation of the lenses can be solved as well. Furthermore, the non-printable pattern is not imaged to the photo-resist layer, and then no redundant pattern from the non-printable pattern is formed in the semiconductor substrate. Therefore, the technical problems of design and space utilization of the semiconductor structure can also be avoided.

The present disclosure is not limited to the above embodiments and can be adjusted or varied properly according to actual demands. For example, the photo-mask may comprise other layers or have other dispositions or arrangements. Otherwise, the semiconductor process may use various step sequences or component configurations, etc. Therefore, the specification and the structures shown in the drawings are used to describe the concepts of the embodiments, and the scope of the invention is not limited thereto. Moreover, it could be understood that the component elements in the embodiments are not limited to the shape and the disposition shown in the drawings, and can be adjusted according to the demand and/or process steps of actual applications without deviating from the spirit of the invention.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A photo-mask, comprising:
a substrate which is transparent;
a non-printable pattern on the substrate and comprising an opaque material; and
a printable pattern comprised of an opaque material on the substrate,
wherein a pattern size of the non-printable pattern is smaller than a critical resolution of a lithography equipment using the photo-mask to perform a lithography process,
wherein the substrate comprising a first substrate region and a second substrate region non-overlapping with the first substrate region, the non-printable pattern is on the first substrate region, the printable pattern is on the second substrate region, a minimum gap distance between the non-printable pattern and the printable pattern is larger than 10 micrometers ($\mu$m).

2. The photo-mask according to claim 1, wherein a pattern size of the printable pattern is equal to or larger than the critical resolution of the lithography equipment using the photo-mask to perform the lithography process.

3. The photo-mask according to claim 1, wherein an area of the first substrate region is larger than an area of the second substrate region.

4. The photo-mask according to claim 1, wherein the pattern size of the non-printable pattern is smaller than 35 nanometers (nm) as the lithography equipment uses an ArF light source.

5. The photo-mask according to claim 1, wherein the pattern size of the non-printable pattern is smaller than 65 nm as the lithography equipment uses a KrF light source.

6. The photo-mask according to claim 1, wherein the non-printable pattern comprises a plurality of pattern dots disposed apart from each other.

7. The photo-mask according to claim 6, wherein a pattern distance between adjacent two pattern dots of the plurality of pattern dots is larger than 50 nm as the lithography equipment uses an ArF light source.

8. The photo-mask according to claim 6, wherein a pattern distance between adjacent two pattern dots of the plurality of pattern dots is larger than 90 nm as the lithography equipment uses a KrF light source.

9. A semiconductor process, comprising:
providing a semiconductor structure, wherein the semiconductor structure comprises a photo-resist layer; and
an exposing step for exposing the photo-resist layer by an exposure light with using a photo-mask, wherein the photo-mask comprises a substrate which is transparent, a non-printable pattern on the substrate and a printable pattern comprised of an opaque material on the substrate, wherein the non-printable pattern of the photo-mask is not transferred to the photo-resist layer through the exposing step, the non-printable pattern of the photo-mask comprises an opaque material, wherein the substrate comprising a first substrate region and a second substrate region non-overlapping with the first substrate region, the non-printable pattern is on the first substrate region, the printable pattern is on the second substrate region, a minimum gap distance between the non-printable pattern and the printable pattern is larger than 10 micrometers (μm).

10. The semiconductor process according to claim 9, wherein the exposing step is for exposing the photo-resist layer by a lithography equipment comprising a light source for providing the exposure light.

11. The semiconductor process according to claim 10, wherein a pattern size of the non-printable pattern is smaller than a critical resolution of the lithography equipment using the photo-mask to perform the exposing step.

12. The semiconductor process according to claim 10, wherein the lithography equipment further comprises a lens, the lens is disposed between the light source and the semiconductor structure.

13. The semiconductor process according to claim 9, wherein the printable pattern of the photo-mask is transferred to the photo-resist layer through the exposing step.

14. The semiconductor process according to claim 13, wherein a pattern size of the printable pattern is equal to or larger than a critical resolution of a lithography equipment using the photo-mask to perform the exposing step.

15. The semiconductor process according to claim 13, wherein the exposure light passes through a region of the photo-mask having the non-printable pattern and a region of the photo-mask having the printable pattern at the same time in the exposing step.

\* \* \* \* \*